(12) United States Patent
Doty et al.

(10) Patent No.: US 7,170,292 B2
(45) Date of Patent: Jan. 30, 2007

(54) NMR MAS INFLOW BERNOULLI BEARING

(75) Inventors: F. David Doty, Columbia, SC (US); Siddarth Shevgoor, Columbia, SC (US)

(73) Assignee: Doty Scientific, Inc., Columbia, SC (US)

(*) Notice: Subject to any disclaimer, the term of this patent is extended or adjusted under 35 U.S.C. 154(b) by 0 days.

(21) Appl. No.: 11/163,344

(22) Filed: Oct. 14, 2005

(65) Prior Publication Data

US 2006/0082371 A1 Apr. 20, 2006

Related U.S. Application Data

(60) Provisional application No. 60/522,621, filed on Oct. 20, 2004.

(51) Int. Cl.
*G01V 3/00* (2006.01)

(52) U.S. Cl. ................................... 324/321
(58) Field of Classification Search .............. 324/321
See application file for complete search history.

(56) References Cited

U.S. PATENT DOCUMENTS

| | | | |
|---|---|---|---|
| 4,201,941 A * | 5/1980 | Fyfe et al. ........... | 324/321 |
| 4,254,373 A | 3/1981 | Lippmaa et al. | |
| 4,275,350 A | 6/1981 | Hill et al. | |
| 4,446,430 A | 5/1984 | Stejskal | |
| 4,456,882 A | 6/1984 | Doty | |
| 4,511,841 A | 4/1985 | Bartuska et al. | |

(Continued)

OTHER PUBLICATIONS

Beams, J. W. High Rotational Speeds, Journal of Applied Physics, Dec. 1937, pp. 795-806, vol. 8.

(Continued)

*Primary Examiner*—Diego Gutierrez
*Assistant Examiner*—Megann E Vaughn
(74) *Attorney, Agent, or Firm*—Oppedahl & Olson LLP

(57) ABSTRACT

An improved axial gas bearing for a gas-driven NMR MAS sample rotor is disclosed that utilizes inward flow with a low rotational component over a rotor conical end. A conical flow region is formed between the rotor conical end and a conical stator bearing surface such that the included angle defining the stator surface is not less than the included angle defining the rotor conical end. Gas is injected radially inward with a significant axial rearward component from a number of small holes at high velocity from the periphery into the conical flow region. Compared to the radial velocity components, the tangential flow components of the injected gas are small and preferably opposed to the direction of the rotor rotation. The high and accelerating negative radial velocities may result in significant Bernoulli effect, such that the mean axial pressure over the conical rotor end may be less than atmospheric pressure for a given axial clearance, but as the clearance decreases, the hydrostatic effects exceed the Bernoulli effects and the mean axial pressure over the conical rotor end may then exceed atmospheric pressure by a substantial amount. Thus, a self-stabilizing axial bearing is formed with improved stability and stiffness for rotor surface speeds up to at least 80% of the speed of sound. Motive power required to spin the rotor may be provided by a radial-inflow microturbine at the opposite end of the rotor in a way that is readily compatible with automatic sample change.

11 Claims, 3 Drawing Sheets

U.S. PATENT DOCUMENTS

| | | |
|---|---|---|
| 4,739,270 A | 4/1988 | Daugaard et al. |
| 4,940,942 A | 7/1990 | Bartuska et al. |
| 5,202,633 A | 4/1993 | Doty et al. |
| 5,298,864 A | 3/1994 | Muller et al. |
| 5,508,615 A | 4/1996 | Doty et al. |
| 6,320,384 B1 | 11/2001 | Doty et al. |
| 6,803,764 B2 | 10/2004 | Hioka |

OTHER PUBLICATIONS

Doty et al., Magnetism in High-Resolution NMR Probe Design. II: HR MAS, Concepts in Magnetic Resonance, Jan. 27, 1998, pp. 239-260, vol. 10 (4).

Doty et al., Recent Advances in Solids NMR Probe Technology, Oct. 1, 2005, Publisher: Doty Scientific, Inc.

* cited by examiner

NMR MAS INFLOW BERNOULLI BEARING

CROSS-REFERENCE TO RELATED APPLICATIONS

This application claims priority from U.S. application Ser. No. 60/522,621, filed Oct. 20, 2004, which application is incorporated herein by reference for all purposes.

FIELD OF THE INVENTION

The field of this invention is high-speed cylindrical ceramic sample spinners, especially for Nuclear Magnetic Resonance (NMR) Magic Angle Spinning (MAS) or for an ultra-centrifuge, employing hydrostatic gas bearings.

BACKGROUND OF THE INVENTION

Because of the richness of the information available from NMR, it has often been argued that NMR is the most powerful analytical technique for molecular structure determination. However, NMR has been more successful with liquids or materials dissolved in solvents than with rigid solids. The basic problem in NMR of solids is that rapid molecular tumbling and diffusion are not naturally present to average out chemical shift anisotropy and dipolar couplings of abundant spin nuclides. Hence, the lines are normally broad and unresolved (often hundreds of ppm in width). A large number of techniques have been developed to improve the resolution in NMR of solids, but most modern techniques include extremely rapid spinning of the sample at the "Magic Angle" (the zero of the second Legendre polynomial, 54.7°) with respect to $B_0$. If the rotational rate is fast compared to chemical shift anisotropies and dipolar couplings (in units of Hz), the resolution is dramatically improved—often by two or three orders of magnitude. Even when the spinning is not fast enough to satisfy the above conditions, substantial improvements in resolution are generally obtained from the combination of MAS and multiple-pulse methods.

Many MAS designs have been based somewhat on the classical work of J. W. Beams, and it is customary to refer to conical bearing/drives of the type detailed most clearly in U.S. Pat. No. 4,511,841 as Beams-type Bernoulli axial-bearing/drives. They comprise a rotor conical end (surface on the end of a rotor) of included angle ~102°, a conical stator surface of included angle ~91° engaging the rotor conical end, and a number of gas-feed holes through the conical stator surface at compound angles producing gas flow in the annular conical space between the stator and rotor surfaces that is characterized as rotational outward flow. Owing to the converging nature of this conical flow space, the radial component of the flow velocity may be sufficiently high at the periphery for a substantial Bernoulli effect, which, depending on various conditions, may exceed the hydrostatic effects nearer the center. As a result, a stable axial bearing may be formed over a rather wide range of spinning speeds, assuming sufficient space is available near the periphery of the conical surfaces for the gas to exhaust with very low back pressure. It is in fact this requirement which leads to the primary limitation of the utility of Beams-type drives in some important MAS applications, as, for example, when a gradient coil or dewar surrounding the spinner makes it impossible to adequately vent the Beams style bearing/drive.

High-speed NMR MAS spinners can be divided into two general classes: (1) designs that are inherently incompatible with automatic sample change because they require complex, high-precision disassembly/reassembly of the sample spinner for rotor changing, and (2) drop-in designs that are in principle compatible with simple automatic rotor changing. This invention belongs in the second of the above classes.

Some MAS designs in the first of the above categories include the following: In U.S. Pat. No. 4,254,373, Lippmaa discloses a double-ended drive design with no effective provision for either axial stability or high drive efficiency. In U.S. Pat. No. 4,456,882 I disclosed an MAS spinner with single-ended drive using cylindrical, ceramic sample containers with press-fit plastic turbines on hydrostatic air bearings that relies on carefully balanced back pressure from a front cover plate for axial stability against a point bearing. In U.S. Pat. No. 5,202,633 I disclosed a high temperature spinner with a hydrostatic axial bearing formed between the flat bottom end of the rotor and the inward flow exhausting from the radial bearing. Note that at the low flow velocities present here, there is no significant Bernoulli effect. In U.S. Pat. No. 5,508,615, I disclose a method of suppressing whirl instability in the radial bearings at very high surface speeds and improving the stability of balanced axial hydrostatic bearings, similar to the one used in U.S. Pat. No. 5,202,633. In U.S. Pat. No. 6,320,384 B1, an MAS spinner similar to that of U.S. Pat. No. 5,508,615 is used with novel methods of improving rf performance. In U.S. Pat. No. 6,803,764, Hioka discloses a design that incorporates many features of the above inventions. For example, it is worth noting that turbines with number of blades prime to the number of nozzles were in the Doty Scientific 4 mm production model XC4 in 1998, and those 4 mm rotors routinely spin at 25 kHz. The Doty Scientific HS5 production units in 1988 were utilizing blade profiles that resulted in a rotationally rearward velocity component in the turbine exhaust.

In U.S. Pat. No. 4,739,270, Daugaard and Langer (known to be the primary inventor here) disclose an outward-flow conical drive turbine at the top end of the rotor that at first glance seems compatible with automatic rotor change; but in practice it has not been, partially because the larger drive cap diameter complicates the flow requirements for the eject gas and partly because of the extreme sensitivity of this design to back pressure at the plug end (as would arise from a sample eject system) or below the drive turbine. It is worth noting that there is little Bernoulli effect in Langer's design. In U.S. Pat. No. 5,298,864, Muller discloses a laser-heated high-temperature spinner in which the axial bearing is formed on the back side of the drive turbine, again with outward flow. With regard to automation, it suffers the same deficiencies as Langer's design.

Some MAS designs in the second of the above two categories include the following: In U.S. Pat. No. 4,275,350, Hill discloses an attempt (which never succeeded) to achieve a spinner compatible with automatic sample change that includes a modified Beams-type conical drive surface. In U.S. Pat. No. 4,446,430, Stejskal discloses an outward-flow Bernoulli axial bearing formed on a flat end of the rotor and fed from a single, axial hole. In the aforementioned U.S. Pat. No. 4,511,841, Bartuska discloses a modified Beams-type drive; and in his later U.S. Pat. No. 4,940,942, he discloses a method of improving its axial stability and providing variable temperature operation for the sample. In U.S. Pat. No. 6,803,764, Hioka discloses a design of unclear novelty that might appear from FIG. 6 therein, similar to prior art by Bruker, to be compatible with automatic sample change; but FIG. 1 and the text imply that a nozzle cap, similar to that in U.S. Pat. No. 4,456,882, is required for stability, which would make it incompatible with automatic sample change. In "Magnetism in HR NMR Probe Design Part II: HR-MAS," *Concepts in Magnetic Resonance*, 10(4) 239–260, 1998, I illustrate in FIG. 7 a modification (which has proved unsuccessful) of the approach by Bartuska.

The axial air bearing of the instant invention utilizes inward flow with minimal rotational component over a rotor conical end to achieve improved stability and stiffness without the need for very-low-back-pressure venting. It is useable at surface speeds from zero to at least 80% of the speed of sound. Moreover, it is readily compatible with automatic sample change.

RELEVANT ART

Non-patent literature
J. W. Beams, J. Appl. Phys. 8, 795–806 (1937).
F. D. Doty, G. Entzminger, and A. Yang, "Magnetism in HR NMR Probe Design Part II: HR-MAS," *Concepts in Magn. Reson.*, 10(4) 239–260, 1998.
Patent Literature
U.S. Pat. No. 4,254,373 Lippmaa et al.
U.S. Pat. No. 4,275,350 Hill
U.S. Pat. No. 4,446,430 Stejskal
U.S. Pat. No. 4,456,882 Doty
U.S. Pat. No. 4,511,841 Bartuska et al.
U.S. Pat. No. 4,739,270 Daugaard et al.
U.S. Pat. No. 4,940,942 Bartuska and Lewis
U.S. Pat. No. 5,202,633 Doty
U.S. Pat. No. 5,298,864 Muller et al.
U.S. Pat. No. 5,508,615 Doty
U.S. Pat. No. 6,320,384 Doty
U.S. Pat. No. 6,803,764, Hioka

SUMMARY OF THE INVENTION

An improved axial gas bearing for a gas-driven NMR MAS sample rotor is disclosed that utilizes inward flow with a low rotational component over a rotor conical end. A conical flow region is formed between the rotor conical end and a conical stator bearing surface such that the included angle defining the stator surface is not less than the included angle defining the rotor conical end. Gas is injected radially inward with a significant axial rearward component from a number of small holes at high velocity from the periphery into the conical flow region. Compared to the radial velocity components, the tangential flow components of the injected gas are small and preferably opposed to the direction of the rotor rotation. The high and accelerating negative radial velocities may result in significant Bernoulli effect, such that the mean static pressure over the conical rotor end may be less than atmospheric pressure for a given axial clearance, but as the clearance decreases, the hydrostatic effects exceed the Bernoulli effects and the mean axial pressure over the conical rotor end may then exceed atmospheric pressure by a substantial amount. Thus, a self-stabilizing axial bearing is formed with improved stability and stiffness for rotor surface speeds up to at least 80% of the speed of sound. Motive power required to spin the rotor may be provided by a radial-inflow microturbine at the opposite end of the rotor in a way that is readily compatible with automatic sample change.

BRIEF DESCRIPTION OF THE DRAWINGS

The invention will be described with respect to a drawing in several figures.

DETAILED DESCRIPTION OF THE PREFERRED EMBODIMENT

Figure 1:
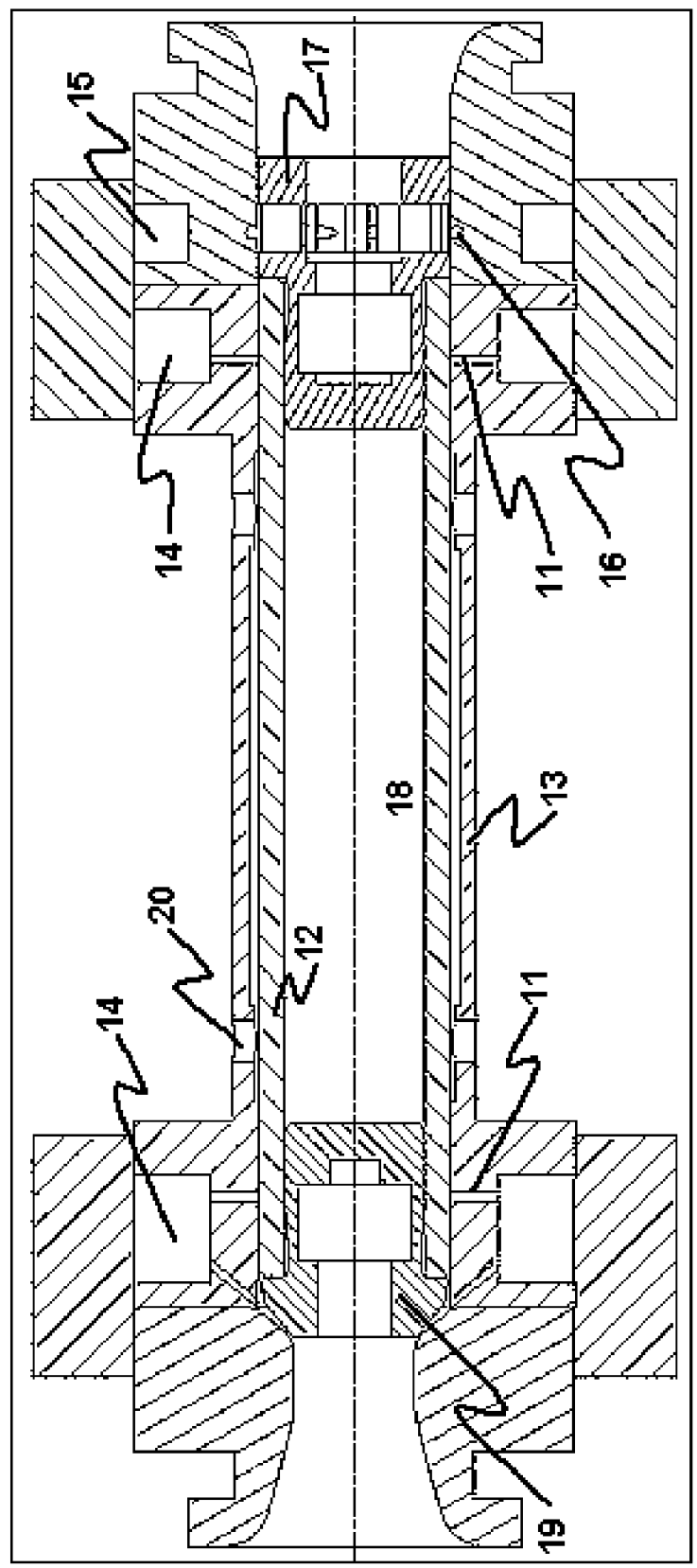
FIG. 1 is a longitudinal view of the rotor and stator with an inflow Bernoulli bearing at the closed end and a drive turbine at the open end.

The high-speed NMR sample spinner shown in FIG. 1 has hydrostatic air radial bearing orifices 11 introducing pressurized gas radially to support the ceramic rotor 12 near both ends inside the ceramic cylindrical stator 13, according to the prior art. Note that these orifices are referred to as radial for convenience, as they establish radial support, but in practice they are typically offset from a purely radial direction. Bearing manifolds 14 are provided for distribution of air to the radial bearing orifices of throat diameter $d_1$, and a drive manifold 15 is provided for distribution of air to the tangentially directed drive nozzles 16, which enable the microturbine 17 at the "top" or "front" of the rotor to spin the rotor 12 and its NMR sample 18. The axial bearing tip 19 is pressed into the "bottom" or "rear" of the rotor. The preferred radial bearing orifice throat diameter $d_1$ is typically about 0.1 mm for a rotor of 2 mm outside diameter, and it is about 0.25 mm for a 14 mm rotor, according to the prior art. Central bearing exhaust holes 20, typically of diameter approximately $4d_1$, are provided at axial locations somewhat closer to the center of the stator than the bearing orifices, in regions where the cylindrical stator inside diameter is greater than in the immediate vicinity of the bearing orifices, according to the prior art. Also, one or more rf coils surrounds the central region of the stator, according to the prior art.

Note that the spinner axis is normally oriented at 54.7° with respect to vertical during operation. Hence, the right side or "top" of FIG. 1 would be elevated with respect to the left side, and gravity would tend to maintain the rotor toward the conical axial bearing surface. However, for very small rotors, the gravitation force may be exceeded by the back pressure in a conventional Beams-type drive/bearing, leading to instability.

Figure 2:
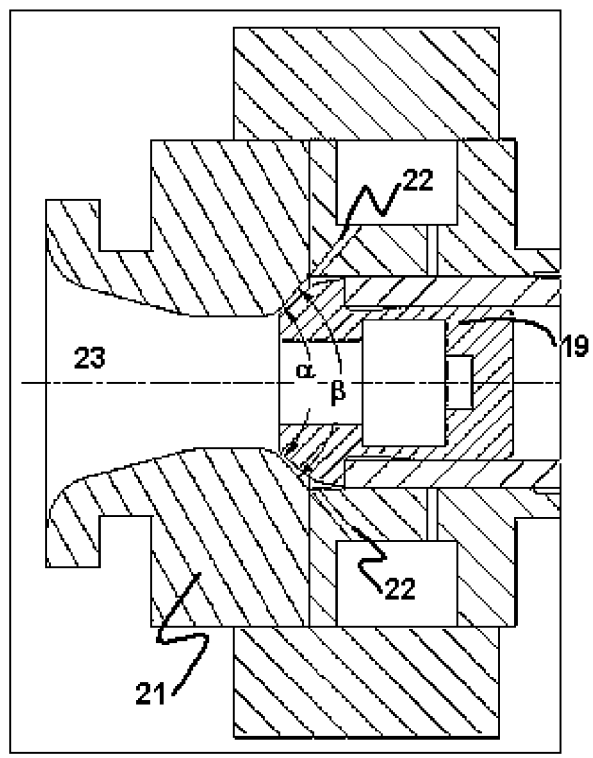
FIG. 2 is an enlargement a longitudinal view of the inflow Bernoulli bearing.
Figure 3:
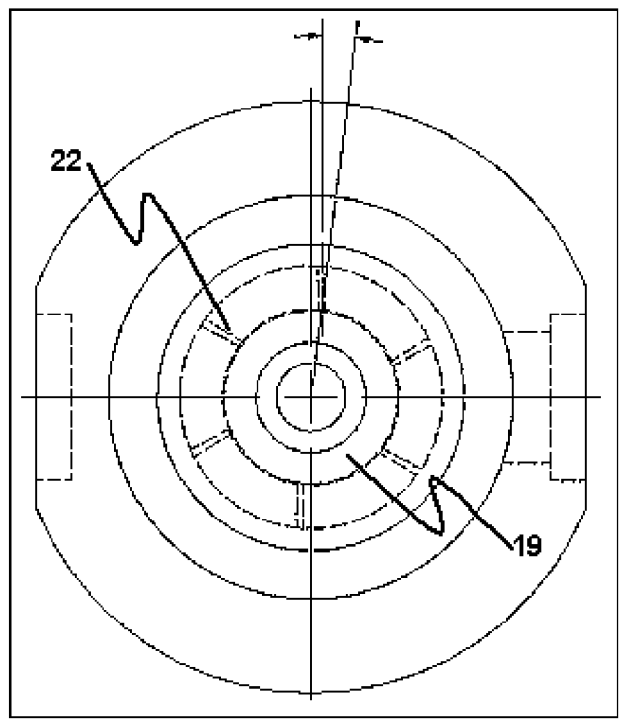
FIG. 3 is an axial view cross section near the bottom end of the rotor.

The inflow-Bernoulli or "Doty" axial bearing is shown in more detail in FIG. 2. The included angle α as shown defining the bearing surface of the tip cap 19 is typically about 90°, but may be as small as 40° or as large as 160°. The included internal mating angle β as shown defining the axial bearing surface of the Doty axial stator 21 is equal to α+δ, where δ is greater than −1° but less than 30°. Note that since the flow is inward, it may be converging and accelerating even if δ is slightly negative. A plurality of uniformly spaced axial bearing nozzles 22 inject pressurized gas rearward into the conical flow space between the axial stator 21 and the tip cap 19. The axial bearing holes may enter at a compound angle with respect to the rotor surface such that there is a substantial axial component rearward toward the axial exhaust hole 23 and a minor tangential component, as approximately depicted in FIG. 3. Typically, the axial velocity component in the axial nozzle 22 will be about 60% but at least greater than 5% of the resultant nozzle velocity magnitude. Note that in FIG. 3, the nozzles are depicted with a minimal rearward component for improved visual clarity, whereas in FIG. 2 they are depicted with a more typical rearward component. The azimuthal angle of the nozzle at entry into the periphery of the conical flow space is typically 7° opposed to the direction of rotation for enhanced tolerance of exhaust back pressure at high spinning rates, though stable operation over a more limited range of conditions is possible with their azimuthal direction assisting rotor rotation.

The axial nozzle 22 throat diameter $d_2$ is typically greater than 50% of $d_1$ and less than 1.8 times $d_1$. The number of axial nozzles is typically not greater than the number of radial bearing orifices 11 at either end. One representative type of tip cap 19 is shown in FIG. 2, in which the minimum diameter of the truncated conical surface on the tip 19 is typically about 60% of the rotor diameter, and the inside is hollowed out. Alternatively, the tip cap may be solid and the conical surface may extend to a point, as in the prior art. The axial exhaust hole 23 may be flared for improved conversion of kinetic pressure to static pressure.

The axial nozzles 22 are normally supplied from the same manifold 14 as the radial bearing orifices, and the pressure in the bearing manifolds is normally maintained to be greater than the pressure in the drive manifold 15. The axial nozzles preferably are converging, and typically the exit diameter is about 15% less than the entrance diameter, for increased exit velocity and hence increased Bernoulli effect and greater tolerance of exhaust backpressure downstream from exhaust hole 23. The total axial nozzle 11 exit flow area, $n\pi d_2^2/4$, where n is the number of axial nozzles, is typically less than one-third of the total radial bearing orifice flow area, $m\pi d_1^2/4$, where m is the number of radial nozzles near each end.

Figure 4:
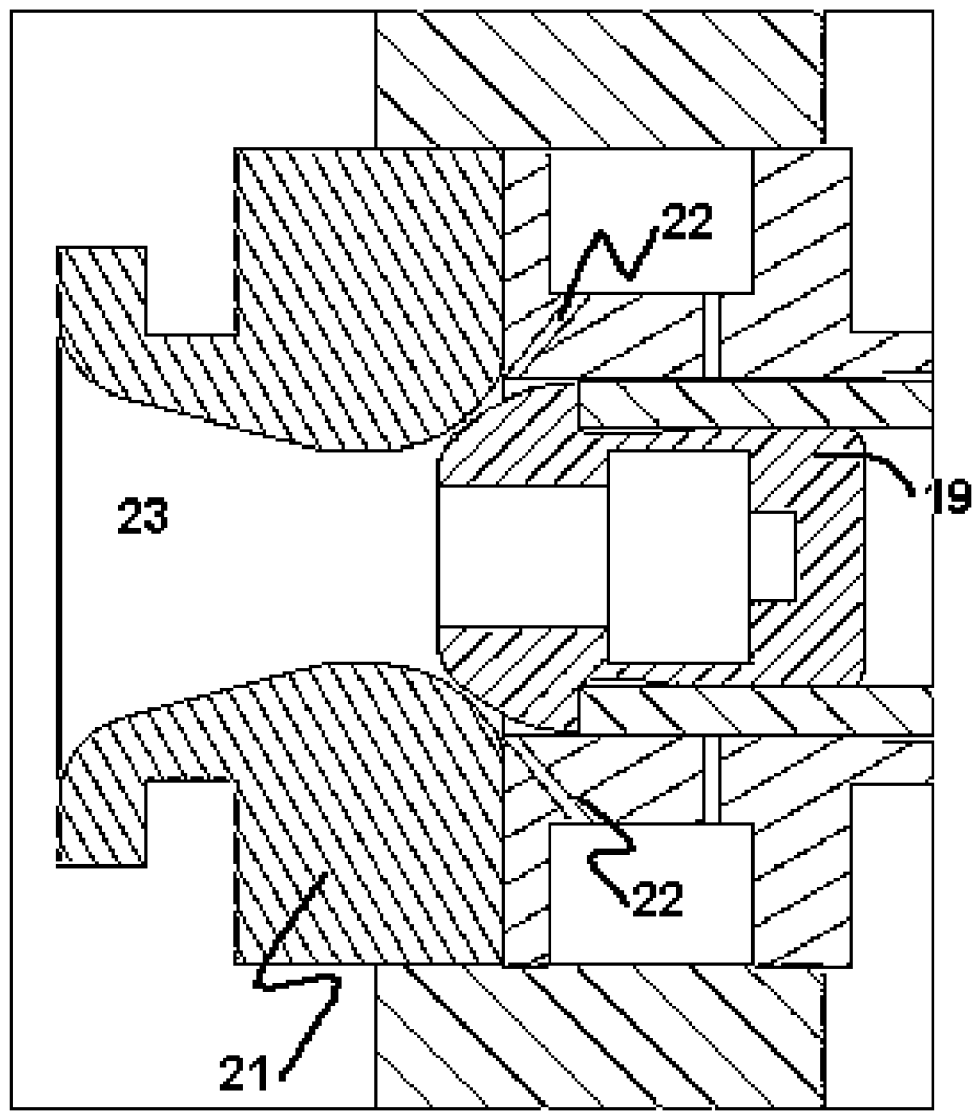
FIG. 4 is a longitudinal view of the inflow Bernoulli bearing, showing a different curvature.

The key to the bearing is obtaining converging flow of high radial velocity, and for this the stator axial bearing surface need not be a simple conical section but may have a convex curvature, as shown in FIG. 4. Moreover, the bearing tip surface also need not be a conical section, but may be a generally convex surface, as shown in FIG. 4, such that converging inward flow occurs between the two surfaces at any radius larger than their contact circle. The converging inward flow produces a maximum radial flow velocity at an angle of typically 45° with respect to the axis of the rotor, but peak radial velocity flow angles between 20° and 80° may also be acceptable.

As is clear from FIG. 1, the top or front opening of the spinner assembly is not obstructed by a turbine-drive nozzle cap at the front end of inside diameter smaller than the rotor outside diameter. Hence, the rotor may be pneumatically ejected from the stator by imposing a flow restriction on the exhaust flow downstream from the axial exhaust hole 23 or by impulse on the conical tip 19 from a stream of gas at high velocity. Subsequently, upon removal of the ejection pressure, a new rotor may be dropped into the spinner assembly. Thus, the spinner is readily compatible with automatic sample change.

The differences between rotational inflow of the instant invention and the rotational outflow in the Beams drive/bearing are substantial. Any inward rotating flow is continuously accelerating, which results in a centrifugal pressure that adds to the static pressure and eventually may exceed the Bernoulli effect. For flow in a vaneless space with negligible friction, conservation of angular momentum requires rotational deceleration of outward flow and rotational acceleration of inward flow. Hence, the static pressure increase is much greater for inward flow than for outward flow for a given initial rotational rate. For inward flow, the static pressure increase from the centripetal acceleration is too great for a high-speed Bernoulli drive/bearing to work, while for outward flow, it often works well, as Beams, Andrew, Bartuska, etc. have shown. To permit the inflow Bernoulli bearing to work, it is necessary to avoid attempting to also use it for rotational drive. In fact, it is beneficial to inject the gas counter to the rotor's rotation to keep the mean rotational speed in the axial bearing space as low as practical. The increased drag on the rotor is of little consequence while the increased suction capacity of the bearing and the increased tolerance to bearing-exhaust back pressure are of considerable benefit in enhancing axial stiffness and stability.

The microturbine 17 may be of the self-shrouded radial inflow type comprising a plurality of radial flow passages and a central axial exhaust hole, according to the prior art. This microturbine type has been found to permit isentropic efficiencies above 35% in the larger NMR rotor sizes. Alternatively, an unshrouded radial inflow type comprising a plurality of radial blades, according to the prior art, may be used.

Although this invention has been described herein with reference to specific embodiments, it will be recognized that changes and modifications may be made without departing from the spirit of the present invention. For example, the cylindrical stator of FIG. 1 is shown as a single part with radial bearings at each end, intended to accept rf coils outside the central region. Clearly, the central portion of the stator could be removed, as is common in the prior art, to permit the rf coils to be positioned closer to the rotor if other means are provided for adequately positioning the separate radial bearings at each end. All such modifications and changes are intended to be included within the scope of the following claims.

What is claimed is:

1. A gas-driven sample spinner assembly, comprising:
   a cylindrical ceramic rotor supported radially by a plurality of radial bearing orifices near each end and rotationally driven by a microturbine at the top end of said rotor;
   a generally convex axial bearing tip surface at the bottom end of said rotor;
   an axial bearing stator surface defining an inward converging flow region between said tip surface and said stator surface;
   a plurality of rearward-directed axial bearing nozzles near the periphery of said axial bearing stator surface for injection of high velocity gas into said inward converging flow region between said stator surface and said tip surface;
   an axial exhaust hole for venting said gas rearward from said converging flow region; and
   one or more rf coils adjacent to the stator surface.

2. The assembly of claim 1 in which the throat diameter of said axial exhaust hole is greater than 30% but less than 80% of the outer diameter of said rotor.

3. The assembly of claim 1 in which said axial bearing nozzles enter said periphery at an azimuthal angle of magnitude less than 15 degrees.

4. The assembly of claim 1 in which said converging flow region produces a maximum radial flow velocity at an acute angle with respect to the axis of said rotor such that said acute angle is greater than 20° and less than 80°.

5. The assembly of claim 1 in which the exit diameter of said axial bearing nozzles is approximately 15% smaller than the entrance diameter of said nozzles.

6. The assembly of claim 5 in which the total exit flow area of said plurality of axial nozzles is less than one-third the total exit flow area of said plurality of radial bearing orifices.

7. The assembly of claim 1 including tangentially directed drive nozzles for driving said microturbine at high rotational rates, said drive nozzles exiting from a cylindrical surface of diameter slightly greater than that of said rotor, said turbine have maximum diameter not greater than that of said rotor.

8. The assembly of claim 7 in which said axial bearing nozzles enter said periphery at an azimuthal angle such as to oppose the direction of rotation produced by said drive nozzles.

9. The assembly of claim 7 in which said microturbine includes enclosed radial flow passages and an axial exhaust hole.

10. A method for use with a first sample spinner spinning on an axis and a stator, the first spinner having a bottom end and a top end, the first spinner containing a sample, the stator having an opening at the top end large enough to permit axial ejection of the first spinner there through, the method comprising the steps of:
  passing gas radially inward toward the bottom end of the first spinner, defining an axial bearing in a converging flow region between the stator and the first spinner;
  passing gas radially inward toward the first spinner, defining radial bearings between the stator and the spinner;
  passing gas radially inward toward the top end of the first spinner, causing the first spinner to spin;
  while gas is passing radially inward toward the bottom end of the first spinner, defining the axial bearing, and while gas is passing radially inward toward the top end of the first spinner, causing the spinner to spin, and while gas is passing radially inward toward the first spinner, defining radial bearings, performing a nuclear magnetic resonance analysis upon the sample by means of one or more rf coils about the center of the first spinner;
  after the performance of the nuclear magnetic resonance analysis upon the sample, ejecting the first spinner pneumatically through the opening at the top end of the stator;
  after the ejection of the first spinner, inserting a second sample spinner into the stator through the opening at the top end of the stator.

11. A stator assembly for use with a gas-driven sample spinner having a top end and a bottom end, the spinner having a generally convex axial bearing tip surface at the bottom end thereof, the assembly comprising:
  a stator and one or more rf coils, the stator comprising:
  a first plurality of radial bearing orifices near a top end of a bore and a second plurality of radial bearing orifices near a bottom end of the bore, the bore shaped to receive the spinner;
  a plurality of turbine orifices near the top end of the bore, said turbine orifices disposed to direct gas toward the spinner;
  an axial bearing stator surface defining an inward converging flow region between said tip surface and said stator surface;
  a plurality of rearward-directed axial bearing nozzles near the periphery of said axial bearing stator surface for injection of high velocity gas into said inward converging flow region between said stator surface and said tip surface; and
  an axial exhaust hole for venting said gas rearward from said converging flow region;
  further characterized in that the one or more rf coils are adjacent to the stator surface.

* * * * *